United States Patent
Chiang et al.

(10) Patent No.: US 8,884,386 B2
(45) Date of Patent: Nov. 11, 2014

(54) MRAM DEVICE AND FABRICATION METHOD THEREOF

(75) Inventors: Tien-Wei Chiang, Taipei (TW); Chwen Yu, Taipei (TW); Ya-Chen Kao, Fuxing Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 36 days.

(21) Appl. No.: 13/364,881

(22) Filed: Feb. 2, 2012

(65) Prior Publication Data

US 2013/0200475 A1    Aug. 8, 2013

(51) Int. Cl.
*H01L 29/82*    (2006.01)

(52) U.S. Cl.
USPC .................. 257/421; 257/E29.323; 365/158

(58) Field of Classification Search
USPC ........................ 257/421, E29.323; 365/158
See application file for complete search history.

(56) References Cited

U.S. PATENT DOCUMENTS

| | | | |
|---|---|---|---|
| 6,603,677 | B2 | 8/2003 | Redon et al. |
| 6,950,335 | B2 | 9/2005 | Dieny et al. |
| 7,009,877 | B1 | 3/2006 | Huai et al. |
| 7,020,009 | B2 | 3/2006 | Ho et al. |
| 7,515,458 | B2 | 4/2009 | Hung et al. |
| 7,796,428 | B2 | 9/2010 | Redon |
| 8,169,816 | B2 | 5/2012 | Min et al. |
| 8,450,722 | B2 | 5/2013 | Liu et al. |
| 8,570,792 | B2 | 10/2013 | Chiang et al. |
| 8,592,927 | B2 * | 11/2013 | Jan et al. ........................ 257/421 |
| 2004/0108561 | A1 | 6/2004 | Jeong |
| 2004/0136120 | A1 * | 7/2004 | Hayakawa et al. ........ 360/324.2 |
| 2008/0278867 | A1 * | 11/2008 | Fukumoto et al. ....... 360/324.12 |
| 2010/0044667 | A1 | 2/2010 | Park et al. |
| 2010/0193889 | A1 * | 8/2010 | Nagahara et al. ............. 257/421 |
| 2011/0164448 | A1 | 7/2011 | Sato et al. |
| 2011/0189796 | A1 * | 8/2011 | Lu et al. ............................ 438/3 |
| 2012/0002330 | A1 | 1/2012 | Matsuzawa et al. |
| 2013/0015538 | A1 | 1/2013 | Liu et al. |

FOREIGN PATENT DOCUMENTS

| | | |
|---|---|---|
| JP | 2004311942 | 11/2004 |
| JP | 2005116888 | 4/2005 |

OTHER PUBLICATIONS

Law, R. et al., "Reduction in critical current for spin transfer switching in perpendicular anisotropy spin valves using an in-plane spin polarizer", Applied Physics Letters, 2009,94:062516-1-062516-3.

Li, H. et al., "Thermal-Assisted Spin Transfer Torque Memory (SIT-RAM) Cell Design Exploration", IEEE Computer Society Annual Symposium on VLSI, 2009, pp. 217-222.

(Continued)

*Primary Examiner* — Victor A Mandala
(74) *Attorney, Agent, or Firm* — Slater & Matsil, L.L.P.

(57) ABSTRACT

A magnetoresistive random access memory (MRAM) device and a method of manufacture are provided. The MRAM device comprises a magnetic pinned layer, a compound GMR structure acting as a free layer, and a non-magnetic barrier layer separating the pinned and GMR layers. The barrier layer is provided to reduce the magnetic coupling of the free layer and GMR structure, as well as provide a resistive state (high or low) for retaining binary data (0 or 1) in the device. The GMR structure provides physical electrode connectivity for set/clear memory functionality which is separated from the physical electrode connectivity for the read functionality for the memory device.

19 Claims, 7 Drawing Sheets

(56) References Cited

OTHER PUBLICATIONS

Liu, L. et al., "Reduction of the spin-torque critical current by partially canceling the free layer demagnetization field", Applied Physics Letters, 2009, 94:122508-1- 122508-3.

Yamahata, S. et al., "InP/InGaAs Collector-Up Heterojunction Bipolar Transistors Fabricated Using Fe-Ion Implantation", Seventh International Conference on Indium Phosphide and Related Materials, May,1995, pp. 652-655.

* cited by examiner

MRAM DEVICE AND FABRICATION METHOD THEREOF

BACKGROUND

An MRAM (Magnetoresistive Random Access Memory) is a form of non-volatile computer memory capable of storing bits of digital information (binary 0's or 1's). MRAM digital data is not stored as an electrical charge as in traditional RAM components, rather the bit state (being 0 or 1) is stored via resistive states (high resistance or low resistance) in magnetic storage elements which do not require constant electrical power to retain their state. An example of a magnetic storage device may consist of a pinned (fixed) magnetic layer, a free (variable) magnetic layer, and a non-magnetic conductive barrier layer interposed between the pinned and free magnetic layers. The relative alignment of the magnetic fields of the pinned and free layers determines the resistive state (high resistance or low resistance) of the barrier layer interposed between the pinned and free magnetic layers.

Changing the resistive state of the MRAM device is controlled by changing the magnetic state of the free layer to either match that of the pinned magnetic layer, or oppose that of the pinned magnetic layer. Matching the magnetic orientation of the free layer to the magnetic orientation of the pinned layer creates a low resistive state in the barrier layer, whereas the stored memory bit information equals the binary value of, for example, 1. Having opposed magnetic orientation between the magnetic free layer and the magnetic pinned layer (the magnetic orientation of the free layer opposes the magnetic orientation of the pinned layer) creates a highly resistive state in the barrier layer, whereas the stored memory bit information equals the binary value of, for example, 0. Typically an MRAM device is formed by placing the pinned, barrier, and free layers between two electrodes in a semiconductor device.

An MRAM device may have operations to set and retrieve data such as read, write-1 (set to value=1) and write-0 (clear set to value=0). Write operations, also called programming operations, apply electrical pulses to the electrodes thereby causing current to flow between the pinned and free layers of the device. Depending upon the direction of the current flow, the magnetic orientation of the free layer will change to either match or oppose the magnetic orientation of the pinned layer. Read operations are also performed across the electrodes by measuring the resistance between the pinned and free layers of the MRAM device.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use respective embodiments, and do not limit the scope of the present disclosure.

Figure 1:
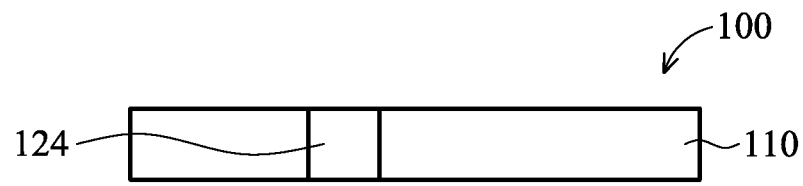
FIGS. 1-6B illustrate a method of forming a phase change memory in accordance with an embodiment.

FIGS. 1-6B illustrate various intermediate stages of a process of forming a memory device in accordance with an embodiment. Referring first to FIG. 1, a portion of a wafer 100 having a dielectric layer 110 containing a first electrode 124 is shown in accordance with an embodiment. It should be noted that the first electrode 124 may be electrically coupled to electronic circuitry (not shown) formed on an underlying substrate (not shown) and/or to an external connection (not shown). For example, in the embodiment illustrated in FIG. 1, the first electrode 124 may be electrically coupled to source/drain regions of a transistor formed on an underlying substrate by a contact (not shown). In this manner, the transistor may be used to control the reading of the state of the subsequently formed memory device.

In an embodiment, the circuitry may further include electronic devices formed on the substrate with one or more dielectric layers overlying the electronic devices. Metal layers may be formed between dielectric layers to route electrical signals between the electronic devices. Electrical devices may also be formed in the one or more dielectric layers. Generally, the inter-layer dielectric (ILD) and inter-metal dielectric (IMD) layers and the associated metallization layers are used to interconnect electrical circuitry formed on an underlying substrate to each other and to provide an external electrical connection.

The dielectric layer 110 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). It should be noted that the dielectric layer 110 may comprise a plurality of dielectric layers.

The first electrode 124 may be formed in the dielectric layer 110 by any suitable process, including a damascene process. Generally a damascene process involves depositing a layer, e.g., the dielectric layer 110, over a substrate and forming a mask (not shown) over the layer. The mask may be patterned using, e.g., photolithography and etching techniques, which involve depositing a photoresist material, masking, exposing, and developing to expose portions of the dielectric layer 110 that are to be removed. The remaining photoresist material protects the underlying material from subsequent processing steps, such as etching. In an embodiment, photoresist material is utilized to create a patterned mask to define the first electrode 124. Openings may be formed using an etching process such as an anisotropic or isotropic etch process, such as an anisotropic dry etch process. After the etching process, any remaining photoresist material may be removed, and thereafter, the openings may be filled with a conductive material, and excess conductive material may be removed using a planarization process, such as a chemical mechanical polishing (CMP) process. Other processes, such as plating and etching, dual damascene, and the like, may also be used.

The first electrode 124 may be formed of any suitable conductive material, such as a highly-conductive, low-resistive metal, elemental metal, transition metal, or the like, including metals or metal alloys including one or more of Al, AlCu, Cu, Ti, TiN, W, and the like. Furthermore, the first electrode 124 may include a barrier/adhesion layer to prevent diffusion and provide better adhesion between the first electrode 124 and the surrounding dielectric layers. The first electrode 124 may be formed, for example, by physical vapor deposition (PVD), atomic layer deposition (ALD), spin-on deposition, or other suitable methods.

It should be noted that the location and shape of the first electrode 124 is provided for illustrative purposes only. Furthermore, the first electrode 124 may include a conductive line and/or redistribution line to extend the first electrode 124 laterally past the overlying memory structure.

Figure 2:
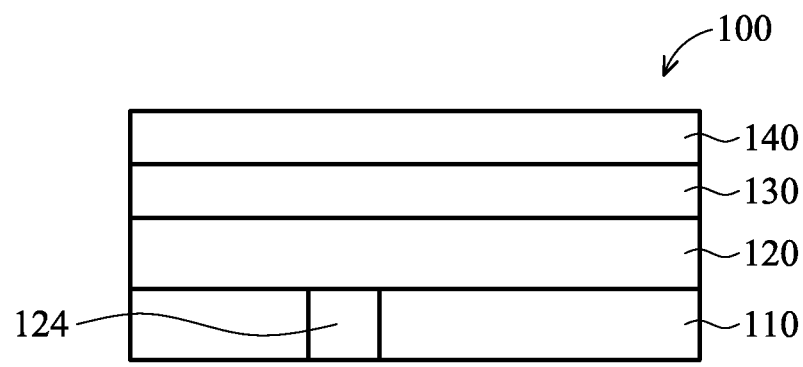

FIG. 2 illustrates formation of a pinned layer 120, a barrier layer 130, and a first ferromagnetic layer 140 in accordance with an embodiment. The pinned layer 120 may be a single layer or a multi-layer structure. For example, in an embodiment, the pinned layer 120 comprises a layer of magnetic materials such as CoFe, CoFeB, NiFe, Co, Fe, Ni, or the like and may have a thickness of about 40 Å to about 200 Å. In another embodiment, the pinned layer 120 may comprise multiple layers, such as a bottom layer formed of a suitable anti-ferromagnetic material, such as PtMn, NiMn, IrMn, FeMn, or the like, and an overlying layer formed of magnetic materials such as CoFe, CoFeB, NiFe, Co, Fe, Ni, or the like. In this embodiment, the bottom anti-ferromagnetic layer may have a thickness of about 40 Å to about 200 Å, and the overlying magnetic layer have a thickness of about 40 Å to about 200 Å.

In yet another embodiment, the pinned layer 120 may comprise an anti-ferromagnetic layer and an overlying giant magnetoresistive structure. The anti-ferromagnetic layer may comprise a suitable anti-ferromagnetic material, such as PtMn, NiMn, IrMn, FeMn, or the like and may have thickness of about 40 Å to about 200 Å. The overlying giant magnetoresistive structure may comprise two magnetic layers with an intervening conductive layer. For example, the two magnetic layers may be formed of any magnetic material, such as CoFe, CoFeB, NiFe, Co, Fe, Ni, FeB, FePt, or the like and may have a thickness of about 10 Å to about 50 Å. The intervening conductive layer may be formed of any suitable conductive material, such as Cu, Ru, Ta, or the like and may have a thickness of about 5 Å to about 20 Å. Other embodiments, however, may utilize different materials, number of layers, thicknesses, and the like.

The barrier layer 130 may be, for example, a dielectric material such as MgO, $Al_2O_3$, and/or the like. In an embodiment, the barrier layer 130 may have a thickness of about 5 Å to about 30 Å.

In an embodiment, the first ferromagnetic layer 140 may be formed of any suitable magnetic material, such as CoFeB, NiFe, Co, Fe, Ni, FeB, FePt, and/or the like, and may be formed to a thickness of about 15 Å to about 50 Å. The first ferromagnetic layer 140 may be formed using any suitable process, such as CVD, PVD, or ALD.

Figure 3:
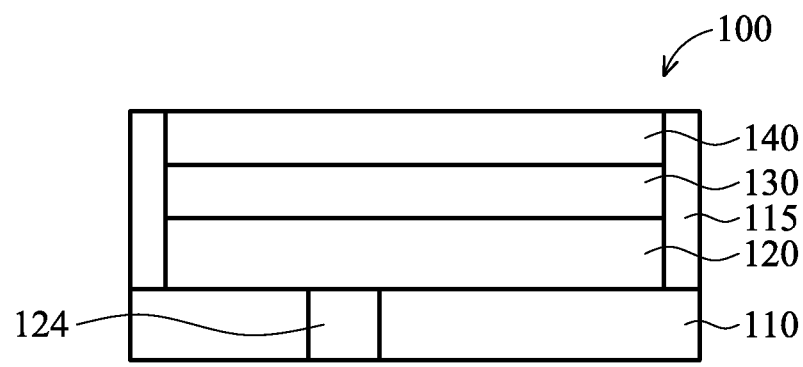

FIG. 3 illustrates the patterning of the pinned layer 120, the barrier layer 130, and the first ferromagnetic layer 140 in accordance with an embodiment. Generally, these layers may be patterned using photolithography techniques by forming a patterned mask to protect the desired portions of the pinned layer 120, the barrier layer 130, and the first ferromagnetic layer 140. Exposed portions may then be removed using one or more acceptable techniques, such as using an anisotropic etch. Thereafter, a second dielectric layer 115 may be formed over the wafer 100. The second dielectric layer 115 may comprise, for example, a low-K dielectric material, such as PSG, BPSG, FSG, $SiO_xC_y$, Spin-On-Glass, Spin-On-Polymers, silicon carbon material, silicon dioxide, TEOS, compounds thereof, composites thereof, combinations thereof, or the like, by any suitable method, such as spinning, CVD and PECVD. It should be noted that the second dielectric layer 115 may comprise a plurality of dielectric layers. A planarization process, such as a CMP process, may be performed to expose the upper surface of the first ferromagnetic layer 140, thereby creating the structure as illustrated in FIG. 3.

Figure 4:
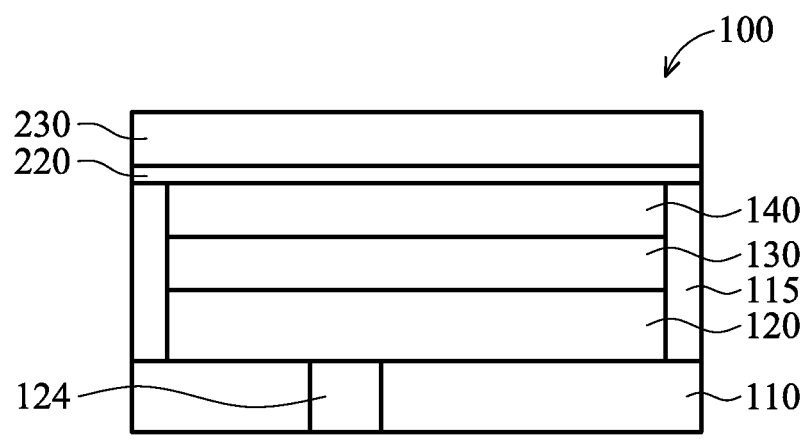

FIG. 4 illustrates the formation of a spacer layer 220 and a second ferromagnetic layer 230 in accordance with an embodiment. The spacer layer 220 may be a conductive layer and formed of any suitable conductive material, including metallic materials such as Cu, Ru, Ta, combinations thereof, and/or the like. In an embodiment, the spacer layer 220 may have a thickness of about 5 Å to about 20 Å. In an embodiment, the spacer layer 220 has a thickness of less than a thickness of the first ferromagnetic layer 140. The second ferromagnetic layer 230 may be formed of any suitable ferromagnetic material, such as CoFeB, NiFe, Co, Fe, Ni, FeB, FePt, and/or the like, and may be formed to a thickness of about 10 Å to about 50 Å.

Figure 5:
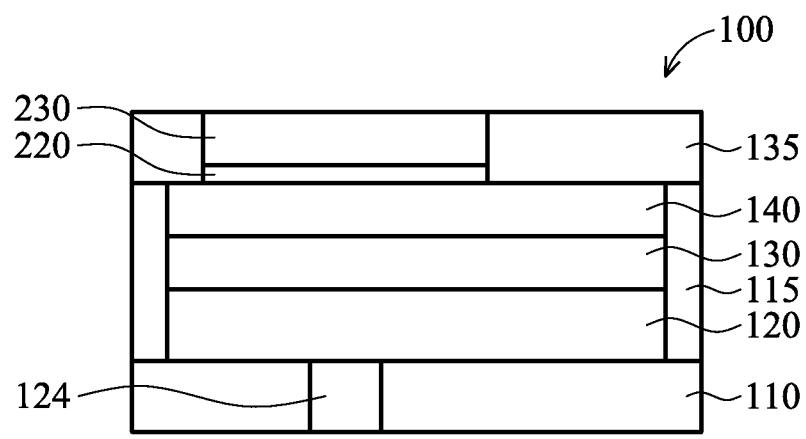

FIG. 5 illustrates patterning of the spacer layer 220 and the second ferromagnetic layer 230 in accordance with an embodiment. The spacer layer 220 and the second ferromagnetic layer 230 may be patterned in a similar manner as that described for the pinned layer 120, the barrier layer 130, and the first ferromagnetic layer 140 with reference to FIG. 3. For example, a mask layer may be formed and photolithography techniques may be used to pattern the mask layer to expose undesired portions of the spacer layer 220 and the second ferromagnetic layer 230. Exposed portions of the spacer layer 220 and the second ferromagnetic layer 230 may be removed using one or more etching processes to form the structure illustrated in FIG. 5. A third dielectric layer 135 may be formed using similar materials and processes as those discussed above with reference to the second dielectric layer 115.

In an embodiment, the first ferromagnetic layer 140, the spacer layer 220 and the second ferromagnetic layer 230 form a GMR (Giant Magnetoresistive) structure. As will be seen, an embodiment uses a GMR structure to replace the free layer of an MRAM device. It should be noted that in the embodiment illustrated in FIG. 5, the second ferromagnetic layer 230 and the spacer layer 220 are patterned to have a different width than the underlying first ferromagnetic layer 140. In this manner, electrical contact may be easily made to the first ferromagnetic layer 140, such as illustrated below with reference to FIGS. 6A and 6B.

As noted above, the pinned layer 120 may also comprise a GMR structure. In this embodiment, the pinned layer 120 comprises a first GMR structure, and the first ferromagnetic layer 140, the spacer layer 220 and the second ferromagnetic layer 230 form a second GMR structure.

Figure 6A:
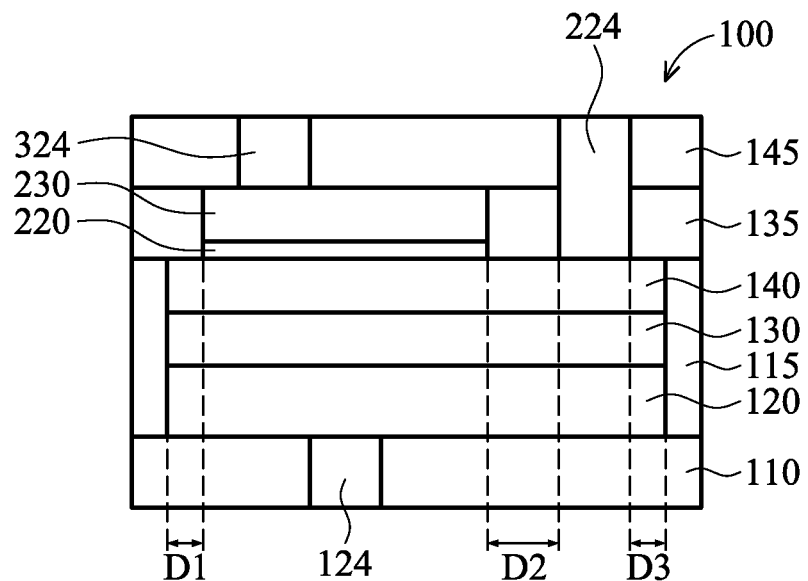
Figure 6B:
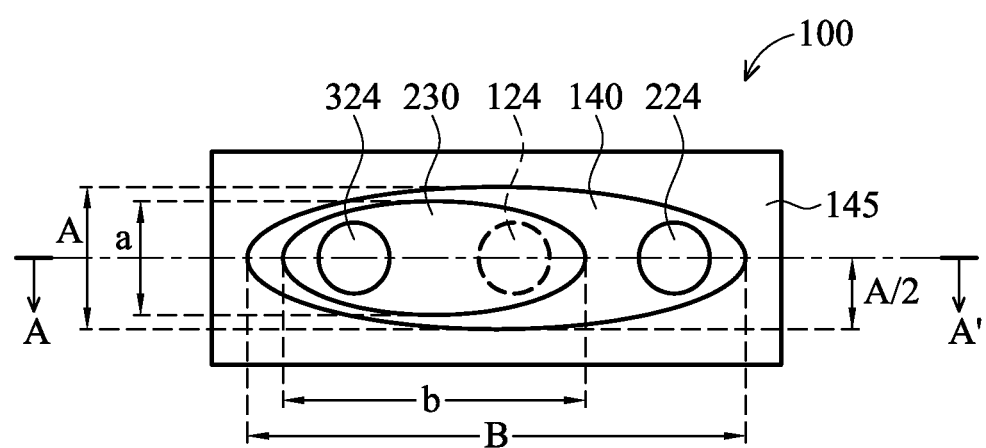

FIGS. 6A and 6B illustrate a cross sectional view and a plan view, respectively, after forming a fourth dielectric layer 145, a second electrode 324, and a third electrode 224 in accordance with an embodiment, wherein the cross-sectional view of FIG. 6A is taken along the A-A' line of FIG. 6B. The fourth dielectric layer 145 may be formed using similar materials and processes as those discussed above with reference to the second dielectric layer 115. Thereafter, the second electrode 324 may be formed through the fourth dielectric layer 145, and the third electrode 224 may be formed through the third dielectric layer 135 and the fourth dielectric layer 145, thereby providing an electrical contact to the second ferromagnetic layer 230 and the first ferromagnetic layer 140, respectively.

FIGS. 6A and 6B further illustrate a relative positioning of the various electrodes and the layers in accordance with an embodiment. For example, distances D1, D2, and D3 have been added to illustrate the placement of the bottom patterned layers (e.g., the pinned layer 120, the barrier layer 130, and the first ferromagnetic layer 140) relative to the top patterned layers (e.g., the spacer layer 220 and the second ferromagnetic layer 230) and relative to the third electrode 224. FIG. 6B illustrates a plan view and illustrates the dimensions of the elliptical pattern of the bottom patterned layers (e.g., the pinned layer 120, the barrier layer 130, and the first ferromagnetic layer 140) as having a length of B and a width of A, and the dimensions of the elliptical pattern of the top patterned layers (e.g., the spacer layer 220 and the second ferromagnetic layer 230) as having a length of b and a width of a.

In an embodiment, distance D1 (a lateral distance from an edge of the bottom patterned layers to a lateral edge of the top patterned layers) may have a value from about 0 nm to about (B–b)/4 nm. Distance D2 (a lateral distance between the top patterned layers and the third electrode 224) may have a range of about 10 nm to about (B–b)/4 nm, and distance D3 (a lateral distance from the third electrode 224 to a lateral edge of the bottom patterned layers) may have a value from about 0 nm to about (B–b)/4 nm. In an embodiment, the first electrode 124, the second electrode 324, and the third electrode 224 may be placed along the centerline of the elliptical shapes, e.g., along the centerline A/2. In an embodiment, an aspect ratio b/a and B/A may be in the range from about 1 to about 3.5. In an embodiment, a may be from about 10 nm to about 100 nm.

It should be noted that the above shapes, dimensions, distances, relative positions, and ratios have been provided for illustrative purposes only. Other embodiments may utilize different shapes (e.g., circular, square, rectangle, etc.), dimensions, relative positions, ratios, and the like.

Figure 7A:
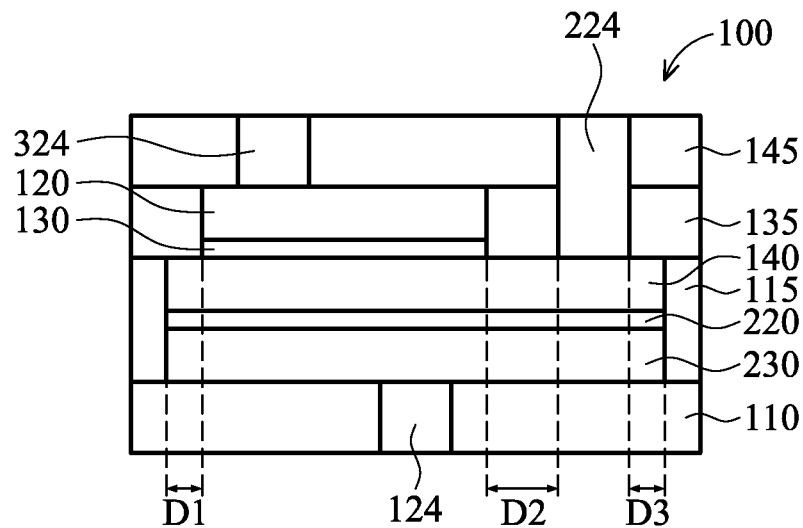
FIGS. 7A through 7B illustrate another embodiment of an MRAM device.
Figure 7B:
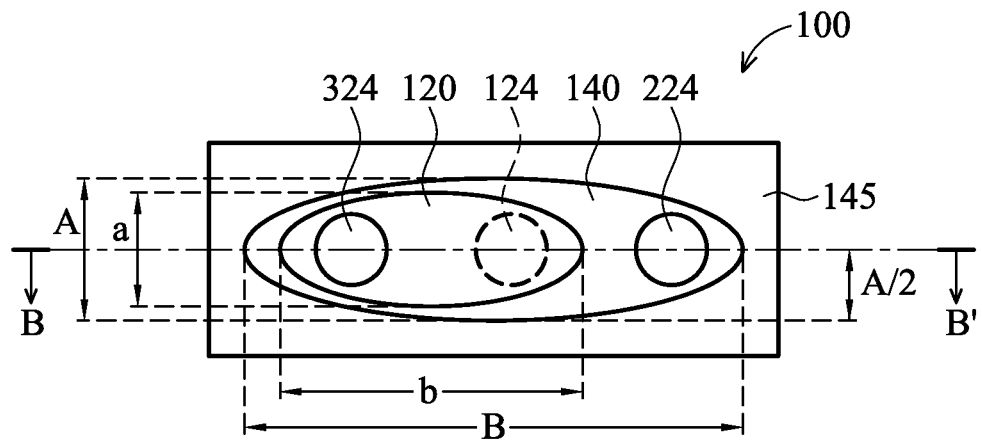

FIGS. 7A and 7B illustrate a cross-sectional view and a plan view, respectively, of another embodiment, wherein the cross-sectional view of FIG. 7A is taken along the B-B' line of FIG. 7B. In this embodiment, the orientation of the pinned layer 120, the barrier layer 130, first ferromagnetic layer 140, spacer layer 220, and second ferromagnetic layer 230 have been reversed in the layering process. This embodiment may utilize similar processes and materials as those discussed above.

FIGS. 7A and 7B also illustrate the relative distance D1, D2, and D3, as well as relative dimensions A, B, a, and b in accordance with an embodiment. In an embodiment, these distances and dimensions may have similar values as discussed above with reference to FIGS. 6A and 6B, wherein in this embodiment the bottom patterned layers comprises the first ferromagnetic layer 140, the spacer layer 220 and the second ferromagnetic layer 230, and the top patterned layers comprise the pinned layer 120 and the barrier layer 130.

FIGS. 8A-8D illustrate an operation of the memory cell in accordance with an embodiment. It should be noted that the operation is described relative to the embodiment illustrated in FIGS. 6A and 6B. In this embodiment, the first electrode 124 functions as a read bit-line (BL), the second electrode 324 functions as a write source line (SL), and the third electrode 224 functions as a write BL.

Figure 8A:
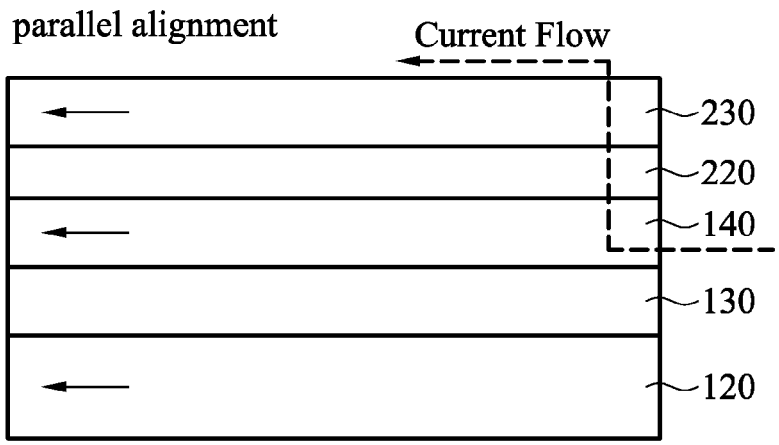
FIGS. 8A through 8D illustrate methods of setting/clearing memory states (writing) and reading memory states in accordance with an embodiment.

Referring now to FIG. 8A, there is illustrated a "write to 0" process where the current flow direction is from the third electrode 224 (electrically coupled to the first ferromagnetic layer 140) to the second electrode 324 (electrically coupled to the second ferromagnetic layer 230) which changes the magnetic orientation of the GMR structure from an anti-parallel alignment to a parallel alignment with respect to the magnetic orientation of the pinned layer 120, therefore creating a low resistance device state. This effectively reduces the current required to switch the magnetization of the free layer (GMR structure) due to the lower resistance of the GMR structure. In addition, the smaller voltage across the barrier layer 130 decreases the chances of exceeding the breakdown voltage and thus reduces the chance of damaging the barrier layer.

Figure 8B:
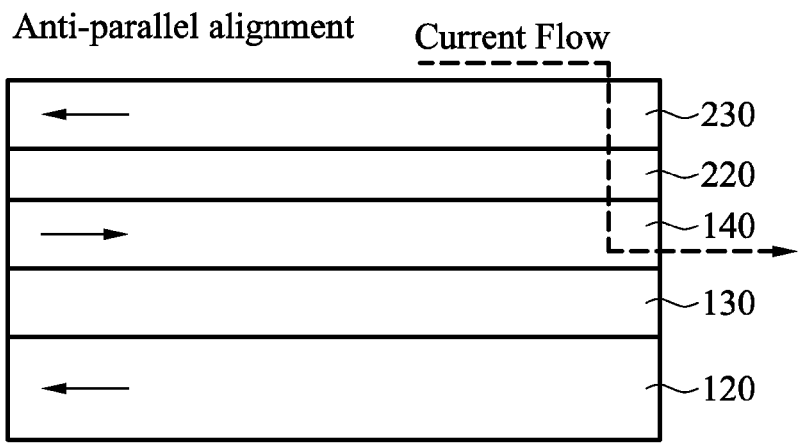

FIG. 8B illustrates a "write to 1" process where the current flow direction is in the reverse direction of the current flow for the "write to 0" process. In the "write to 1" process, the current flows from the second electrode 324 (electrically coupled to the second ferromagnetic layer 230) to the third electrode 224 (electrically coupled to the first ferromagnetic layer 140) which changes the magnetic orientation of the GMR structure from a parallel alignment to an anti-parallel alignment with respect to the magnetic orientation of the pinned layer 120, therefore creating a high resistant device state. The process of passing the current through the GMR structure bypasses the need to pass current through the barrier layer 130 and the pinned layer 120. This effectively reduces the current required to switch the magnetization of the free layer (GMR structure) due to the lower resistance of the GMR structure. In addition, the smaller voltage across the barrier layer 130 decreases the chances of exceeding the breakdown voltage and thus reduces the chance of damaging the barrier layer 130.

Figure 8C:
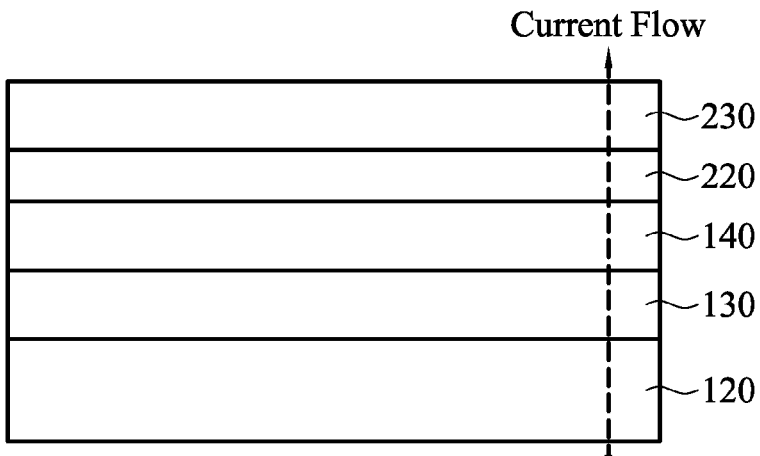
Figure 8D:
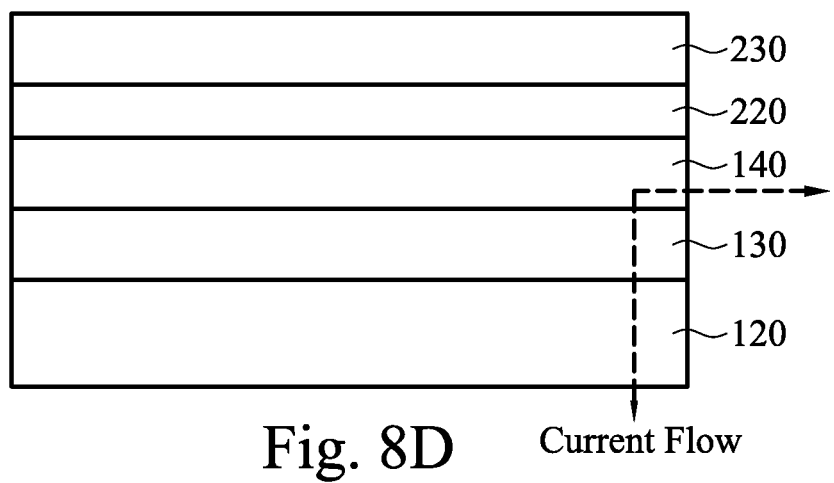

FIGS. 8C and 8D illustrate various embodiments of a device read process. In an embodiment such as that illustrated in FIG. 8C, the read process detects the resistive state (low or high) of the MRAM device by applying a small voltage between the first electrode 124 (electrically coupled to the pinned layer 120) and the second electrode 324 (electrically coupled to the second ferromagnetic layer 230) and sampling the current. In another embodiment such as that illustrated in FIG. 8D, the read process detects the resistive state (low or high) of the STT-MRAM device by applying a small voltage between the first electrode 124 (electrically coupled to the pinned layer 120) and the third electrode 224 (electrically coupled to the first ferromagnetic layer 140) and sampling the current. Due to the small voltage needed to perform a read, the read process has little effect on the barrier breakdown voltage. In addition, having separate electrodes for reading and writing to/from the storage device may allow for higher speed read/write access to stored data in the device.

Read/write processes similar to previously described processes for the device in FIGS. 6A and 6B may be used for embodiments such as those illustrated in FIGS. 7A and 7B. For example, referring to FIG. 7A, a write process may be induced by utilizing the first electrode 124 (electrically coupled to the second ferromagnetic layer 230) and the second electrode 324 (electrically coupled to the pinned layer 120) of the device. To perform a read, an embodiment may utilize the first electrode 124 (electrically coupled to the second ferromagnetic layer 230) and the second electrode 324 (electrically coupled to the pinned layer 120). In another embodiment, the first electrode 124 (electrically coupled to the second ferromagnetic layer 230) and the third electrode 224 (electrically coupled to the first ferromagnetic layer 140) may be used to read the device.

Figure 9:
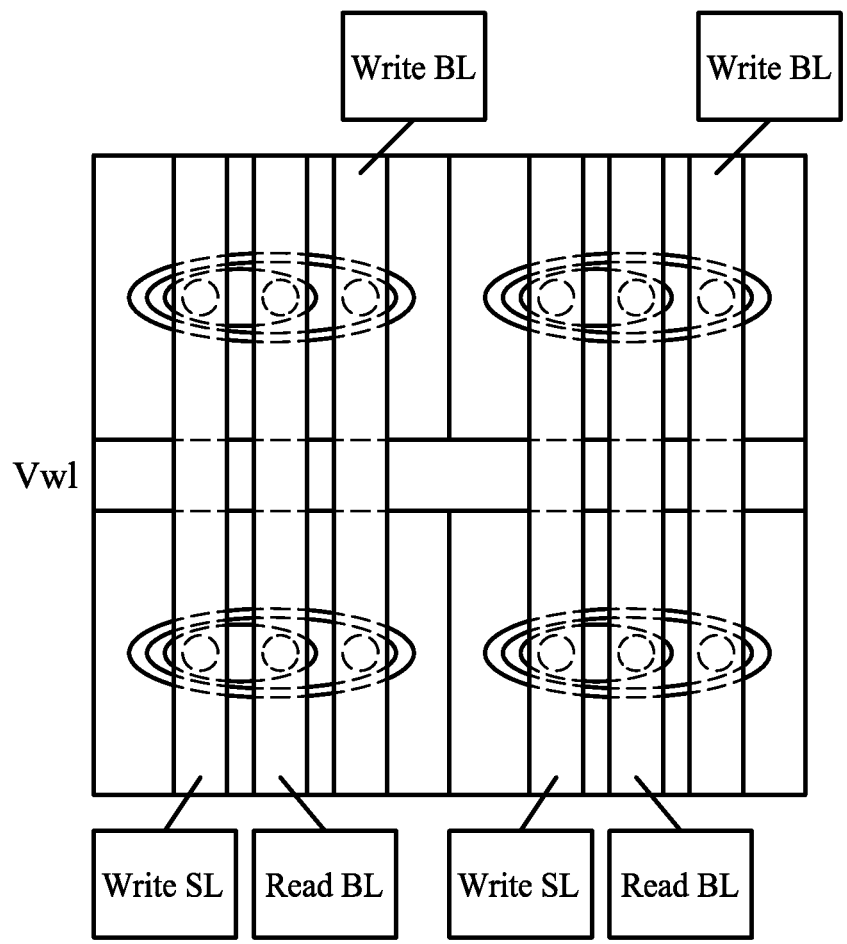
FIG. 9 illustrates an MRAM array in accordance with an embodiment.

FIG. 9 illustrates an array of MRAM devices such as those discussed above in accordance with an embodiment. A write SL line is connected to the second electrode 324, a write BL is connected to the third electrode 224, and a Read BL is connected to the first electrode 124 of the device pictured in FIG. 6A.

In an embodiment, an MRAM is provided. The MRAM comprises a pinned magnetic layer, a barrier layer adjacent the pinned magnetic layer, and a GMR structure adjacent the barrier layer. The GMR structure comprises a first magnetic layer, a second magnetic layer, and a conductive layer interposed between the first magnetic layer and the second magnetic layer, the first magnetic layer having a different size than the second magnetic layer in a plan view.

In another embodiment, an MRAM is provided. The MRAM comprises a pinned layer, a barrier layer adjacent the pinned layer, and a GMR structure adjacent the barrier layer. The GMR structure comprises a first magnetic layer, a second magnetic layer, and a conductive layer interposed between the first magnetic layer and the second magnetic layer. The MRAM further comprises a first write electrode coupled to the first magnetic layer and a second write electrode coupled to the second magnetic layer.

In yet another embodiment, an MRAM is provided. The MRAM comprises a pinned layer, a barrier layer adjacent the pinned layer, a first magnetic layer adjacent the barrier layer, a conductive layer adjacent the first magnetic layer, a second magnetic layer adjacent the conductive layer, a first electrode coupled directly to the first magnetic layer, and a second electrode coupled directly to the second magnetic layer.

Although the present disclosure and its advantages have been described in detail, it should be understood that various changes, substitutions and alterations can be made herein without departing from the spirit and scope of the disclosure as defined by the appended claims. For example, different types of materials and processes may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A magnetoresistive random access memory (MRAM) comprising:
a pinned magnetic layer;
a barrier layer adjacent the pinned magnetic layer; and
a giant magnetoresistance (GMR) structure adjacent the barrier layer, the GMR structure comprising a first magnetic layer, a second magnetic layer, and a conductive layer interposed between the first magnetic layer and the second magnetic layer, wherein the pinned magnetic layer, the barrier layer, and the GMR structure are laterally over a dielectric layer, wherein the MRAM is capable of reading a resistance state between the second magnetic layer and the pinned layer.

2. The MRAM of claim 1, further comprising:
a first electrode electrically coupled to the pinned magnetic layer;
a second electrode electrically coupled to the first magnetic layer of the GMR structure; and
a third electrode electrically coupled to the second magnetic layer of the GMR structure.

3. The MRAM of claim 2, wherein the first electrode and the second electrode are located along a longitudinal axis of the first magnetic layer in the plan view.

4. The MRAM of claim 1, wherein the first magnetic layer is closer to the barrier layer than the second magnetic layer, the second magnetic layer being thicker than the first magnetic layer.

5. The MRAM of claim 1, wherein the second magnetic layer has a shape having an aspect ratio of length to width of about 1 to about 3.5.

6. The MRAM of claim 1, wherein the pinned magnetic layer, the barrier layer, and the first magnetic layer have a same length and width in the plan view, and the conductive layer and the second magnetic layer have a same length and width in the plan view.

7. The MRAM of claim 1, wherein the pinned magnetic layer and the barrier layer have a same length and width in the plan view, and first magnetic layer, the conductive layer and the second magnetic layer have a same length and width in the plan view.

8. The MRAM of claim 1, wherein the MRAM is in a low resistance state and a magnetic orientation of the GMR structure is parallel to a magnetic orientation of the pinned layer.

9. The MRAM of claim 1, wherein the MRAM is in a high resistance state, and a magnetic orientation of the GMR structure is anti-parallel to a magnetic orientation of the pinned layer.

10. A magnetoresistive random access memory (MRAM) comprising:
a dielectric layer;
a pinned layer;
a barrier layer adjacent the pinned layer;
a giant magnetoresistance (GMR) structure adjacent the barrier layer, the GMR structure comprising a first magnetic layer, a second magnetic layer, and a conductive layer interposed between the first magnetic layer and the second magnetic layer, the pinned layer, the barrier layer, and the GMR structure being over the dielectric layer;
a first write electrode coupled to the first magnetic layer;
a second write electrode coupled to the second magnetic layer. layer; and
a third electrode coupled to the pinned layer, at least one of the first write electrode, the second write electrode, and the third electrode extending through the dielectric layer.

11. The MRAM of claim 10, wherein the first magnetic layer has a shape having an aspect ratio of length to width of about 1 to about 3.5 in a plan view.

12. The MRAM of claim 10, wherein the first magnetic layer has a greater length than the second magnetic layer in a plan view.

13. The MRAM of claim 10, wherein the first magnetic layer has a greater length than the pinned layer in a plan view.

14. The MRAM of claim 10, wherein the pinned layer is a multi-layer structure.

15. A magnetoresistive random access memory (MRAM) comprising:
a pinned layer;
a barrier layer adjacent the pinned layer;
a first magnetic layer adjacent the barrier layer;
a conductive layer adjacent the first magnetic layer;
a second magnetic layer adjacent the conductive layer, wherein the first magnetic layer has a same length and width in a plan view as at least one of the pinned layer and the second magnetic layer;
a first electrode coupled directly to the first magnetic layer; and
a second electrode coupled directly to the second magnetic layer.

16. The MRAM of claim 15, wherein the MRAM is capable of reading a resistance state between the second magnetic layer and the pinned layer.

17. The MRAM of claim 15, wherein the pinned layer and the barrier layer have a same length and width as the first magnetic layer.

18. The MRAM of claim 15, wherein first magnetic layer, the conductive layer, and the second magnetic layer have a greater width than the pinned layer in a plan view.

19. The MRAM of claim 15, further comprising a third electrode coupled to the pinned layer.

* * * * *